(12) United States Patent
Tanaka et al.

(10) Patent No.: US 6,590,368 B2
(45) Date of Patent: Jul. 8, 2003

(54) INPUT CIRCUIT WITH FUNCTION FOR DETECTING ABNORMALITY IN INPUT CIRCUIT AND CONTROL DEVICE HAVING THE SAME

(75) Inventors: Kenji Tanaka, Aichi (JP); Mitsuo Mori, Aichi (JP); Kenji Kotani, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 10/025,417

(22) Filed: Dec. 19, 2001

(65) Prior Publication Data

US 2002/0118020 A1 Aug. 29, 2002

(30) Foreign Application Priority Data

Dec. 19, 2000 (JP) ........................................ 2000-385376

(51) Int. Cl.[7] .............................. G05F 1/56; H02M 3/24
(52) U.S. Cl. .......................................... 323/268; 363/80
(58) Field of Search ................................ 323/282, 283, 323/284, 285, 272, 273, 274, 275, 268, 269; 363/49, 56, 80; 123/338, 339, 361, 403

(56) References Cited

U.S. PATENT DOCUMENTS

| | | | | |
|---|---|---|---|---|
| 4,672,518 A | * | 6/1987 | Murdock | ...................... 363/80 |
| 4,823,749 A | * | 4/1989 | Eisenmann et al. | ..... 123/339.21 |
| 5,892,647 A | * | 4/1999 | Mizoe | ........................ 361/101 |
| 5,994,884 A | * | 11/1999 | Paterno | ...................... 323/268 |

* cited by examiner

Primary Examiner—Rajnikant B. Patel
(74) Attorney, Agent, or Firm—Synnestvedt & Lechner LLP

(57) ABSTRACT

An input circuit that detects an abnormality of a voltage generation of the input circuit. The circuit includes an external output terminal, an analog voltage generator. The generator includes a power supply terminal, a grounding terminal, and an internal output terminal. The circuit includes a first resistor, which is connected to the power supply and to the power supply terminal, a second resistor, which is connected to the ground and to the grounding terminal, a third resistor, which is connected to the internal output terminal and to the external output terminal, and a fourth resistor, which is connected to the node of the third resistor and the external output terminal and to the ground. When the grounding terminal or the power supply terminal is open, the analog voltage of the external output terminal is in an upper limit fail voltage range or in a lower limit fail voltage range.

10 Claims, 2 Drawing Sheets

INPUT CIRCUIT WITH FUNCTION FOR DETECTING ABNORMALITY IN INPUT CIRCUIT AND CONTROL DEVICE HAVING THE SAME

BACKGROUND OF THE INVENTION

The present invention relates to an input circuit and a control device having the controller. More specifically, the present invention pertains to an input circuit that varies an analog voltage and outputs the voltage to a control system, and to a control device having the input circuit.

FIG. 1 is a circuit diagram showing a prior art control device 100. The control device 100 includes an input circuit 50 and a control circuit 58, and is located, for example, in an air conditioner controller of a vehicle.

The input circuit 50 has a variable resistor 51 and a fixed resistor 57. The variable resistor 51 includes a resistance element 52 and a slider 55.

A first end of the resistance element 52 is connected to a power supply terminal 53, and a second end is connected to a grounding terminal 54. A first end of the slider 55 slides on the resistance element 52, and a second end is connected to an output terminal 56. The output terminal 56 is connected to the control circuit 58 through the fixed resistor 57.

The slider 55 slides between the first end and the second end of the resistance element 52 in accordance with movement of a control knob (not shown). As the slider 55 slides, resistance between the power supply terminal 53 and the output terminal 56 is changed. As a result, the value of the analog voltage outputted from the input circuit 50 to the control circuit 58 is changed.

If the voltage of the power supply is 5V, the analog voltage is varied in a range between zero volts to approximately five volts. When the analog voltage is maximum (approximately five volts) or minimum (zero volts), the control circuit 58 generates a control signal for maximizing or minimizing the heating performance or cooling performance. When the analog voltage is about the intermediate value (2.5V), cooling or heating is stopped. At this time, the slider 55 is approximately at the center of the resistance element 52.

If the grounding terminal 54 of the resistance element 52 is open, the value of the analog voltage is greater than a normal state. If the power supply terminal 53 of the resistance element 52 is open, the analog voltage is always zero. If such abnormalities occur, it may be impossible to set the analog voltage about intermediate level (2.5V). As a result, even if there is an abnormality, cooling or heating cannot be stopped. Contrarily, cooling or heating may be undesirably maximized.

If the output terminal 56 of the variable resistor 51 is open, the analog voltage is not supplied to the control circuit 58 from the power supply. The analog voltage is influenced by external electromagnetic waves and becomes unstable. In other words, the unstable analog voltage is supplied to the control circuit 58. This may cause the control circuit 58 to generate control signals that repetitively and rapidly start and stop cooling and heating.

SUMMARY OF THE INVENTION

Accordingly, it is an objective of the present invention to provide an input circuit that detects an abnormality of a voltage generation and easily and reliably informs a control system of the abnormality. Another objective of the present invention is to provide a control device that includes such an input circuit.

To achieve the foregoing and other objectives and in accordance with the purpose of the present invention, an input circuit having a function for detecting an abnormality of the input circuit is provided. The input circuit includes an external output terminal, an analog voltage generator, a first resistor, a second resistor, a third resistor, and a fourth resistor. The analog voltage generator is connected to a power supply and to a ground. The analog voltage generator generates an analog voltage. The analog voltage generator includes a power supply terminal connected to the power supply, a grounding terminal connected to the ground, and an internal output terminal for supplying the analog voltage to the external output terminal. The first resistor is connected to the power supply and to the power supply terminal. The second resistor is connected to the ground and to the grounding terminal. The third resistor is connected to the internal output terminal and to the external output terminal. The fourth resistor is connected to the node of the third resistor and the external output terminal and to the ground. The resistances of the first and second resistors are smaller than the resistances of the third and fourth resistors such that, in a normal state, the analog voltage of the external output terminal is in a normal voltage range, which is narrower than the voltage range between the power supply and the ground, such that, when the grounding terminal is open, the analog voltage of the external output terminal is in an upper limit fail voltage range, which is outside of the normal voltage range, and such that, when the power supply terminal is open, the analog voltage of the external output terminal is in a lower limit fail voltage range, which is outside of the normal voltage range.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
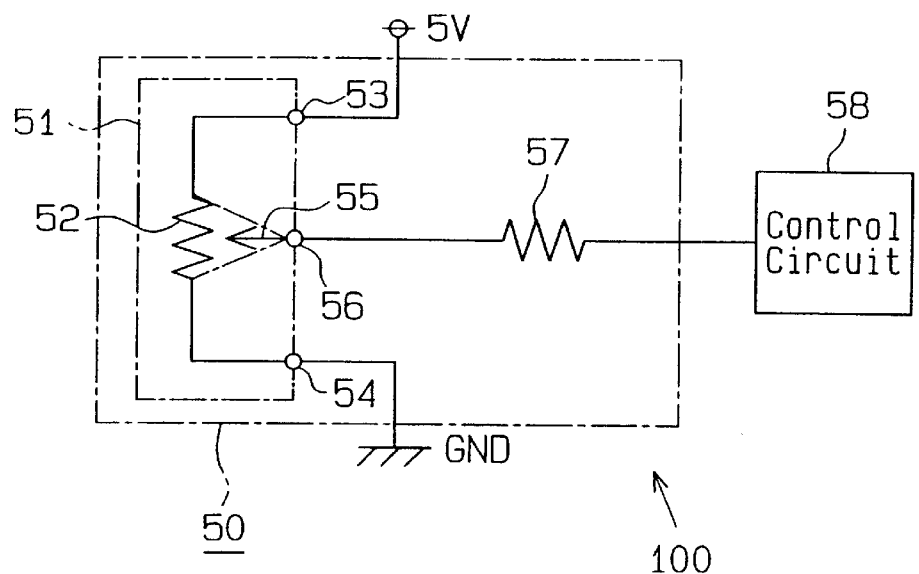
FIG. 1 is a circuit diagram showing a prior art controller.

In the drawings, like numerals are used for like elements throughout.

Figure 2:
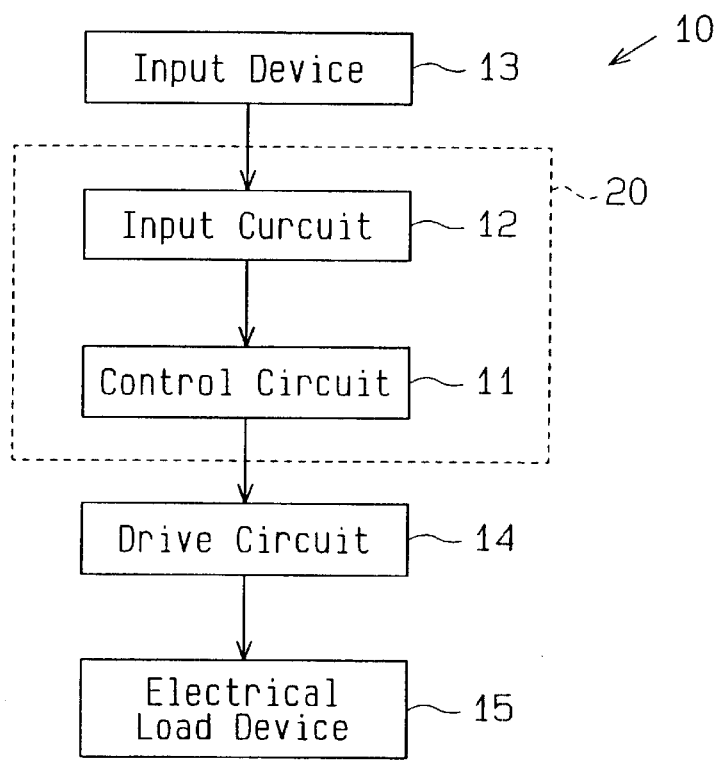
FIG. 2 is an electrical block diagram showing an air conditioner controller having a controller according to one embodiment of the present invention.
Figure 3:
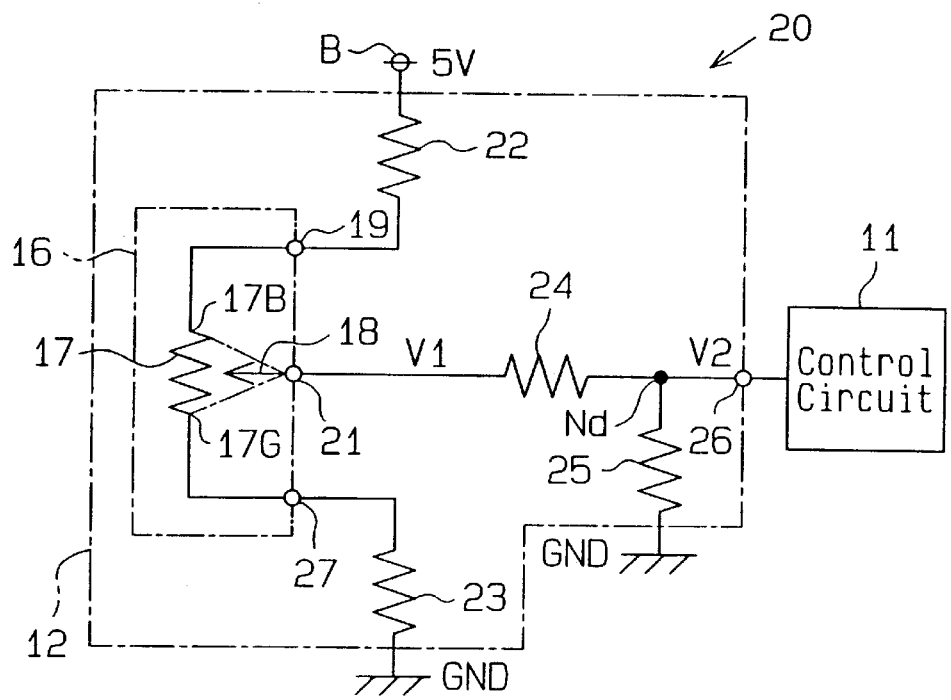
FIG. 3 is a circuit diagram showing the controller shown in FIG. 2.

FIG. 2 is a block diagram illustrating an air conditioner control apparatus 10 of a vehicle. The control apparatus 10 includes a control device 20. FIG. 3 is a circuit diagram showing the control device 20.

The control device 20 includes a control circuit 11 and an input circuit 12, and controls the cooling and heating performance of an electrical load device 15.

As shown in FIG. 2, an input device 13 is connected to the input circuit 12. The output of the control circuit 11 is connected to a drive circuit 14. An electrical load device 15 is connected to the control circuit 11 through the drive circuit 14.

The input device 13 includes a knob (not shown). The knob is manipulated for adjusting an analog voltage V2 of the input circuit 12. The electrical load device 15 receives a control signal generated by the control circuit 11 through the drive circuit 14, and starts or stops cooling or heating according to the received signal.

The input circuit 12 will now be described.

As shown in FIG. 3, the input circuit 12 includes a variable resistor (analog voltage generator) 16, first to third fixed resistors 22, 23, 24, and a pull-down resistor 25. The variable resistor 16 includes a resistance element 17, a slider 18, a power supply terminal 19, a grounding terminal 27, and an internal output terminal 21. The slider 18 slides on the resistance element 17.

A power supply end 17B of the resistance element 17 is connected to the power supply terminal 19, and a grounding end 17G is connected to the grounding terminal 27. The slider 18 is connected to the internal output terminal 21.

The power supply terminal 19 is connected to a power supply B through the first fixed resistor (first resistor) 22, and the grounding terminal 27 is connected to the ground GND through the second fixed resistor (second resistor) 23. The internal output terminal 21 is connected to the control circuit 11 through the third fixed resistor (third resistor) 24 and an external output terminal 26. The pull-down resistor (fourth resistor) 25 is connected to the node Nd of the third resistor 24 and the external output terminal 26 and to the ground GND.

As the knob (not shown) is manipulated, the slider 18 slides on the resistance element 17, which varies the resistance between the power supply B and the internal output terminal 21. Accordingly, the analog voltage V1 of the internal output terminal 21 is changed.

When the slider 18 is at a grounding end 17G, the cooling performance of the electrical load device 15 is maximized. When the slider 18 is at a power supply end 17B, the heating performance of the electrical load device 15 is maximized. When the slider 18 is approximately at the center of the resistance element 17, the electrical load device 15 does not perform cooling or heating.

The voltage of the power supply B is 5V, and the resistance of the resistance element 17 is 5 kΩ. The resistance of the first fixed resistor 22 is 390Ω. The resistance of the second fixed resistor 23 is 200Ω. The resistance of the third fixed resistor 24 is 10 kΩ. The resistance of the pull-down resistor 25 is 100 kΩ.

When the slider 18 is at the grounding end 17G of the resistance element 17, the analog voltage (the analog voltage of the external output terminal) V2 supplied to the control circuit 11 is the minimum value Vmin. The minimum value Vmin is computed by the following equations according to Ohm's law.

The combined resistance R1 of the grounding end 17G and the ground GND is computed as follows:

$$R1=(200*110000)/(200+110000)$$

The total resistance R2 of the input circuit 12 is computed as follows:

$$R2=5390+R1$$

The total current I1 of the input circuit 12 is computed as follows:

$$I1=5/R2$$

The analog voltage V1 is computed as follows using the combined resistance R1 and the total current I1:

$$V1=I1*R1$$

Accordingly, the minimum value Vmin of the analog voltage V2 is computed as follows:

$$Vmin=(V1*100000)/110000=\text{approximately } 0.16 \text{ (V)}.$$

When the slider 18 is at the power supply end 17B of the resistance element 17, the analog voltage V2 supplied to the control circuit 11 is the maximum value Vmax. The maximum value Vmax is computed by the following equations.

The combined resistance R3 of the power supply end 17B of the resistance element 17 and the ground GND is computed as follows:

$$R3=(5200*110000)/(5200+110000)$$

The total resistance R4 of the input circuit 12 is computed as follows:

$$R4=390+R3$$

The total current I2 of the input circuit 12 is computed as follows:

$$I2=5/R4$$

The analog voltage VI is computed as follows using the combined resistance R3 and the total current I2:

$$V1=I2*R3$$

Accordingly, the maximum value Vmax of the analog voltage V2 is computed as follows:

$$Vmax=(V1*100000)/110000=\text{approximately } 4.21 \text{ (V)}.$$

When the slider 18 is approximately at the center of the resistance element 17, the analog voltage V2 supplied to the control circuit 11 is a value Vfin. The value Vfin is computed by the following equations.

The combined resistance R5 of the approximate center of the resistance element 17 and the ground GND is computed as follows:

$$R5=(2700*110000)/(2700+110000)$$

The total resistance R6 of the input circuit 12 is computed as follows:

$$R6=2890+R5$$

The total current I3 of the input circuit 12 is computed as follows:

$$I3=5/R6$$

The analog voltage V1 is computed as follows using the combined resistance R5 and the total current I3:

$$V1=I3*R5$$

Accordingly, the value Vfin of the analog voltage V2 is computed as follows:

$$Vfin=(V3*100000)/110000=\text{approximately } 2.16 \text{ (V)}.$$

Figure 4:
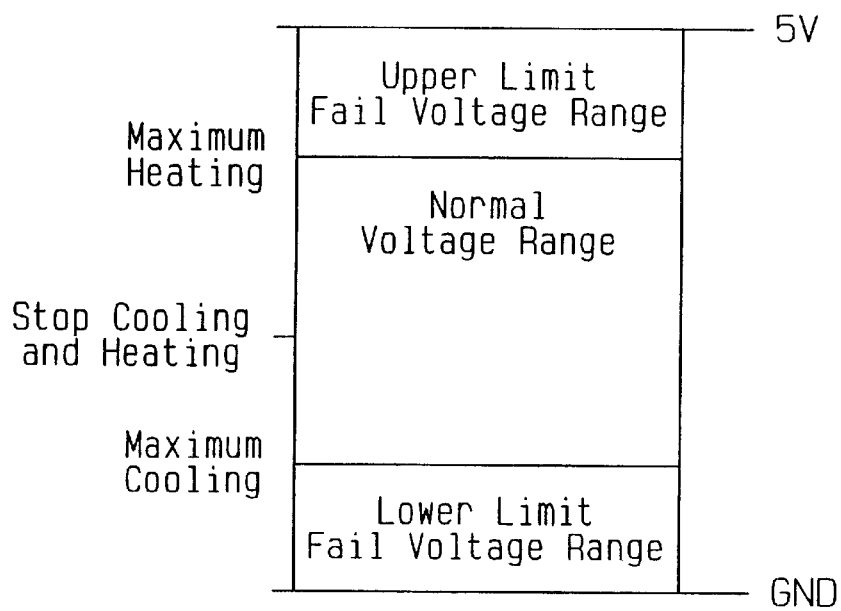
FIG. 4 is a chart showing the ranges of analog output voltage and air conditioning performance.

Therefore, when the slider 18 slides on the resistance element 17 according to the manipulation of the knob (not shown), the analog voltage V2 varies between approximately 0.16V and approximately 4.21V. In other words, the range from approximately 0.16V to approximately 4.21V is a normal voltage range of the analog voltage V2. The normal voltage range is narrower than the voltage range between the power supply B and the ground GND (5V). The range from 0V to approximately 0.16V is a lower limit fail voltage range of the analog voltage V2. The range from approximately 4.21V to 5V is an upper limit fail voltage range of the analog voltage V2 (see FIG. 4).

Normally, the value of the analog voltage V2 is in the normal range. When receiving the analog voltage V2 having a value that is in the upper limit fail voltage range or in the lower limit fail voltage range, the control circuit 11 judges that there is an abnormality. In this case, the control circuit 11 generates a signal for stopping cooling or heating.

The resistance of the pull-down resistor 25 (100 kΩ) is sufficiently greater than the resistance of the resistance element 17 (5 kΩ) and than the resistance of the third resistor 24 (10 kΩ). Therefore, when the analog voltage V2 varies in the normal range, the voltage resolution of the control circuit 11 is maintained to a level of a case in which the control device 20 does not have the pull-down resistor 25.

The resistance of the first fixed resistor 22 and the resistance of the second fixed resistor 23 (390Ω, 200Ω) are sufficiently smaller than the resistance of the third fixed resistor 24 and the resistance of the pull-down resistor 25 (10 kΩ, 100 kΩ). Therefore, when the analog voltage V2 is in the normal range, the voltage resolution of the control circuit 11 is maintained to a level of a case in which there are no upper limit fail voltage range and no lower limit fail voltage range. In other words, the resistances of the first fixed resistor 22 and the second fixed resistor 23 are determined such that the fail voltage ranges are not excessively wide. The resistances of the fixed resistors 22, 23 are determined such that, if the power supply terminal 19 or the grounding terminal 27 of the variable resistor 16 is open, the analog voltage V2 is either in the upper or lower fail voltage ranges regardless of the position of the slider 18.

The operation of the air conditioner control apparatus 10 will now be described. First the operation of the air conditioner control apparatus 10 when the input circuit 12 is operating normally will be described.

As an operator manipulates the knob (not shown) of the input device 13, the slider 18 slides on the resistance element 17. Accordingly, the analog voltage V2 supplied to the control circuit 11 is changed within the normal range from 0.16V to 4.21V. The control circuit 11 performs computation based on the analog voltage V2 and generates a control signal in accordance with the computation. The control signal is supplied to the electrical load device 15 through the drive circuit 14. The electrical load device 15 performs cooling or heating in accordance with the control signal.

When the slider 18 is substantially at the center of the resistance element 17, the value of the analog voltage V2 is 2.16V. In this case, the control circuit 11 generates a signal for stopping cooling and heating and sends the signal to the drive circuit 14. Then, the drive circuit 14 stops the cooling or heating.

Next, the operation of the air conditioner control apparatus 10 when an abnormality occurs in the input circuit 12 will be described. Specifically, a case in which there is a break between the ground GND and the variable resistor 16 will be described. In this case the grounding terminal 27 of the variable resistor 16 is open.

The second fixed resistor 23 is not connected to the grounding end 17G, and the second resistor 23 is separated from the input circuit 12. When the slider 18 is at the power supply end 17B in this state, the value of the analog voltage V2 is represented by the following equation:

$V2=100000*(5/110390)$=approximately 4.53(V)

If the slider 18 is located at the grounding end 17G, the analog voltage V2 is represented by the following equation:

$V2=100000*(5/115390)$=approximately 4.33(V).

Therefore, when the grounding terminal 27 of the variable resistor 16 is open, the analog voltage V2 changes in the upper limit fail voltage range, or from approximately 4.33V to approximately 4.52V. The control circuit 11 judges that there is an abnormality, and generates a signal for stopping cooling or heating.

A case in which there is a break between the power supply B and the variable resistor 16 will now be described. In this case, the power supply terminal 19 of the variable resistor 16 is open. In this state, no voltage is supplied from the power supply B to the control circuit 11. However, since the grounding terminal 27 of the variable resistor 16 is connected to the ground GND through the second fixed resistor 23, the analog voltage V2 of 0V is supplied to the control circuit 11. The voltage V2 of 0V is in the lower limit fail voltage range. Therefore, the control circuit 11 judges that there is an abnormality, and generates a signal for stopping cooling or heating.

A case in which the internal output terminal 21 of the variable resistor 16 is open will now be described. In this case, no voltage is supplied to the control circuit 11 from the power supply B. However, since the pull-down resistor 25 is connected to the ground GND, the analog voltage V2 of 0V is supplied to the control circuit 11. As a result, the control circuit 11 judges that there is an abnormality, and generates a signal for stopping cooling or heating. Since the pull-down resistor 25 is connected to the ground GND, the control circuit 11 is not influenced by external electromagnetic waves.

The control device 20 has the following advantages.

(1) The first fixed resistor 22 is located between the variable resistor 16 and the power supply B, and the second fixed resistor 23 is located between the variable resistor 16 and the ground GND. The resistances of the first and second resistors 22, 23 are determined such that, if the power supply terminal 19 or the grounding terminal 27 of the variable resistor 16 is open, the analog voltage V2 is in the upper or lower limit fail voltage ranges. When in one of the limit fail voltage ranges, the analog voltage V2 represents that there is an abnormality in the input circuit 12. Therefore, abnormalities in the input circuit 12 are easily detected, and the air conditioning system is easily stopped, accordingly.

(2) The resistances of the first and second fixed resistors 22, 23 are sufficiently smaller than the resistances of the third fixed resistor 24 and the pull-down resistor 25. Therefore, the upper and lower limit fail voltage ranges are not excessively widened, and the voltage resolution of the control circuit 11 is not deteriorated. Therefore, the normal range of the analog voltage V2 is reliably obtained.

(3) The pull-down resistor 25, the resistance of which is greater than those of the third fixed resistor 24 and the resistance element 17, is located between the output of the third fixed resistor 24 and the ground GND. Therefore, if the internal output terminal 21 is open, the analog voltage V2 in the lower limit fail voltage range is supplied to the control circuit 11. Therefore, the control circuit 11 reliably detects the abnormality in the input circuit 12 and stops the air conditioning system.

(4) The resistance of the pull-down resistor 25 is sufficiently greater than the resistances of the resistance element 17 and the third fixed resistor 24. Therefore, the upper and lower limit fail voltage ranges are not excessively widened, and the voltage resolution of the control circuit 11 is not deteriorated. Therefore, the normal range of the analog voltage V2 is reliably obtained.

(5) When the analog voltage V2 is in the upper or lower fail voltage ranges, the control circuit 11 judges that there is an abnormality and sends a control signal to the electrical load device 15 to stop cooling or heating. In other words, when there is an abnormality in the input circuit 12, the air conditioning system is easily stopped.

(6) The ranges near the upper limit value and the lower limit value of the analog voltage V2 are defined as the upper and lower limit fail voltage ranges, in which the control circuit 11 is judged to have an abnormality. Therefore, the control device 20 is suitable for a system that does not stop cooling or heating when the analog voltage V2 is in the vicinity of the upper or lower limit of the voltage range.

It should be apparent to those skilled in the art that the present invention may be embodied in many other specific forms without departing from the spirit or scope of the invention. Particularly, it should be understood that the invention may be embodied in the following forms.

The resistances of the resistance element 17, the first to third fixed resistors 22, 23, 24, and the pull-down resistor 25 may be any values as long as the upper and lower limit fail voltage ranges are obtained, and as long as the analog voltage V2 is reliably changed to a value in the upper or lower limit fail voltage range when there is an abnormality. Also, the value of the power supply B is not limited 5V.

The input circuit 12 and the control device 20 may be applied to any apparatus that does not stop cooling or heating when the analog voltage V2 is in the vicinity of the upper limit or the lower limit.

The value of the analog voltage V2 at which the electrical load device 15 stops cooling or heating may be any value as long as it is within the normal input range.

When having determined that there is an abnormality, the control circuit 11 may supply a signal to a warning device (not shown) to warn the operator of the abnormality.

The control device 20 may control the electrical load device 15 such that the cooling performance is maximized when the slider 18 is at the power supply end 17B of the resistance element 17 and that the heating performance is maximized when the slider 18 is at the ground end 17G of the resistance element 17.

Therefore, the present examples and embodiments are to be considered as illustrative and not restrictive and the invention is not to be limited to the details given herein, but may be modified within the scope and equivalence of the appended claims.

What is claimed is:

1. An input circuit having a function for detecting an abnormality of the input circuit, comprising:

an external output terminal;

an analog voltage generator, which is connected to a power supply and to a ground, wherein the analog voltage generator generates an analog voltage, wherein the analog voltage generator includes a power supply terminal connected to the power supply, a grounding terminal connected to the ground, and an internal output terminal for supplying the analog voltage to the external output terminal;

a first resistor, wherein the first resistor is connected to the power supply and to the power supply terminal;

a second resistor, wherein the second resistor is connected to the ground and to the grounding terminal;

a third resistor, wherein the third resistor is connected to the internal output terminal and to the external output terminal; and a fourth resistor, wherein the fourth resistor is connected to the node of the third resistor and the external output terminal and to the ground;

wherein the resistances of the first and second resistors are smaller than the resistances of the third and fourth resistors such that, in a normal state, the analog voltage of the external output terminal is in a normal voltage range, which is narrower than the voltage range between the power supply and the ground, such that, when the grounding terminal is open, the analog voltage of the external output terminal is in an upper limit fail voltage range, which is outside of the normal voltage range, and such that, when the power supply terminal is open, the analog voltage of the external output terminal is in a lower limit fail voltage range, which is outside of the normal voltage range.

2. The input circuit according to claim 1, wherein the input circuit is connected to a control circuit, which receives the analog voltage of the external output terminal; and wherein the resistances of the first, second and fourth resistors are determined such that the control circuit maintains a predetermined voltage resolution in the normal voltage range.

3. The input circuit according to claim 1, wherein the analog voltage generator includes a resistance element; and wherein the fourth resistor has a resistance that is greater than the resistances of the resistance element and the third resistor such that the analog voltage of the external output terminal is in the lower limit fail voltage range when the internal output terminal is open.

4. The input circuit according to claim 3, wherein the input circuit is connected to a control circuit, which receives the analog voltage of the external output terminal; and wherein the resistances of the first, second and fourth resistors are determined such that the control circuit maintains a predetermined voltage resolution in the normal voltage range.

5. A control device, comprising:

an input circuit having a function for detecting an abnormality of the input circuit, wherein the input circuit includes:

an external output terminal;

an analog voltage generator, which is connected to a power supply and to a ground, wherein the analog voltage generator generates an analog voltage, wherein the analog voltage generator includes a power supply terminal connected to the power supply, a grounding terminal connected to the ground, and an internal output terminal for supplying the analog voltage to the external output terminal;

a first resistor, wherein the first resistor is connected to the power supply and to the power supply terminal;

a second resistor, wherein the second resistor is connected to the ground and to the grounding terminal;

a third resistor, wherein the third resistor is connected to the internal output terminal and to the external output terminal; and a fourth resistor, wherein the fourth resistor is connected to the node of the third resistor and the external output terminal and to the ground;

wherein the resistances of the first and second resistors are smaller than the resistances of the third and fourth resistors such that, in a normal state, the analog voltage of the external output terminal is in a normal voltage range, which is narrower than the voltage range between the power supply and the ground, such that, when the grounding terminal is open, the analog voltage of the external output terminal is in an upper limit fail voltage range, which is outside of the normal voltage range, and such that, when the power supply terminal is open, the analog voltage of the external output terminal is in a lower limit fail voltage range, which is outside of the normal voltage range;

wherein the control device further includes a control circuit, which is connected to the input circuit, wherein, when receiving an analog voltage that is in the normal voltage range from the input circuit, the control circuit generates a control signal in accordance with the analog voltage; and wherein, when receiving an analog voltage that is in the upper limit fail voltage range or in the lower limit fail voltage range from the input circuit, the control circuit determines that there is an abnormality in the input circuit.

6. The control device according to claim 5, wherein the control device is connected to an electrical load device; and wherein, when receiving the analog voltage of the external output terminal that is equal to a predetermined value, which is between the upper limit value and the lower limit value of the normal voltage range, from the input circuit, the control circuit stops operation of the electrical load device.

7. A control device, comprising:

an input circuit having a function for detecting an abnormality of the input circuit, wherein the input circuit includes:

an external output terminal;

an analog voltage generator, which is connected to a power supply and to a ground, wherein the analog voltage generator generates an analog voltage, wherein the analog voltage generator includes a power supply terminal connected to the power supply, a grounding terminal connected to the ground, and an internal output terminal for supplying the analog voltage to the external output terminal;

a first resistor, wherein the first resistor is connected to the power supply and to the power supply terminal;

a second resistor, wherein the second resistor is connected to the ground and to the grounding terminal;

a third resistor, wherein the third resistor is connected to the internal output terminal and to the external output terminal; and a fourth resistor, wherein the fourth resistor is connected to the node of the third resistor and the external output terminal and to the ground;

wherein the resistances of the first and second resistors are smaller than the resistances of the third and fourth resistors such that, in a normal state, the analog voltage of the external output terminal is in a normal voltage range, which is narrower than the voltage range between the power supply and the ground, such that, when the grounding terminal is open, the analog voltage of the external output terminal is in an upper limit fail voltage range, which is outside of the normal voltage range, and such that, when the power supply terminal is open, an analog voltage that is in a lower limit fail voltage range is generated, the lower limit voltage range being outside of the normal voltage range;

wherein the analog voltage generator includes a resistance element;

wherein the fourth resistor has a resistance that is greater than the resistances of the resistance element and the third resistor such that the value of the analog voltage is in the lower limit fail voltage range when the internal output terminal is open, wherein the control device further includes a control circuit, which is connected to the input circuit, wherein, when receiving an analog voltage that is in the normal voltage range from the input circuit, the control circuit generates a control signal in accordance with the analog voltage; and wherein, when receiving an analog voltage that is in the upper limit fail voltage range or in the lower limit fail voltage range from the input circuit, the control circuit determines that there is an abnormality in the input circuit.

8. The control device according to claim 7, wherein the control device is connected to an electrical load device; and wherein, when receiving the analog voltage of the external output terminal that is equal to a predetermined value, which is between the upper limit value and the lower limit value of the normal voltage range, from the input circuit, the control circuit stops operation of the electrical load device.

9. An input circuit having a function for detecting an abnormality of the input circuit, comprising:

an external output terminal;

an analog voltage generator, which is connected to a power supply and to a ground, wherein the analog voltage generator generates an analog voltage, wherein the analog voltage generator includes a power supply terminal connected to the power supply, a grounding terminal connected to the ground, and an internal output terminal for supplying the analog voltage to the external output terminal;

a first resistor, wherein the first resistor is connected to the power supply and to the power supply terminal;

a second resistor, wherein the second resistor is connected to the ground and to the grounding terminal;

a third resistor, wherein the third resistor is connected to the internal output terminal and to the external output terminal; and a fourth resistor, wherein the fourth resistor is connected to the node of the third resistor and the external output terminal and to the ground.

10. The control device according to claim 9, wherein the resistances of the first and second resistors are smaller than the resistances of the third and fourth resistors.

* * * * *